US009716305B2

(12) United States Patent
Nguyen et al.

(10) Patent No.: US 9,716,305 B2
(45) Date of Patent: Jul. 25, 2017

(54) BALUN

(71) Applicant: BAE SYSTEMS plc, London (GB)

(72) Inventors: Mark Christopher Nguyen, Chelmsford-Essex (GB); Gareth Michael Lewis, Chelmsford-Essex (GB); Richard John Harper, Chelmsford-Essex (GB)

(73) Assignee: BAE SYSTEMS plc, London (GB)

( * ) Notice: Subject to any disclaimer, the term of this patent is extended or adjusted under 35 U.S.C. 154(b) by 75 days.

(21) Appl. No.: 14/407,735

(22) PCT Filed: Jun. 17, 2013

(86) PCT No.: PCT/GB2013/051571
§ 371 (c)(1),
(2) Date: Dec. 12, 2014

(87) PCT Pub. No.: WO2013/190275
PCT Pub. Date: Dec. 27, 2013

(65) Prior Publication Data
US 2015/0145745 A1 May 28, 2015

(30) Foreign Application Priority Data
Jun. 19, 2012 (GB) .................................. 1210816.3

(51) Int. Cl.
*H01P 5/10* (2006.01)
*H01P 5/16* (2006.01)
*H01Q 21/00* (2006.01)
*H03H 7/42* (2006.01)

(52) U.S. Cl.
CPC .................. *H01P 5/16* (2013.01); *H01P 5/10* (2013.01); *H01Q 21/0075* (2013.01)

(58) Field of Classification Search
CPC ............ H01P 5/10; H01P 5/1007; H03H 7/42
USPC ...................................................... 333/25, 26
See application file for complete search history.

(56) References Cited

U.S. PATENT DOCUMENTS 4,882,553 A * 11/1989 Davies .................. H01P 5/1007 333/246
6,498,540 B2 12/2002 Deckman
6,538,614 B2 * 3/2003 Fleming ................. H01Q 9/045 343/767
6,674,340 B2 * 1/2004 Quan ...................... H01P 1/127 333/164
(Continued)

FOREIGN PATENT DOCUMENTS

JP 2241102 A 9/1990
JP 2001326508 A 11/2001
(Continued)

OTHER PUBLICATIONS

International Search Report and Written Opinion received for Patent Application No. PCT/GB2013/051571, mailed on Sep. 19, 2013. 12 pages.
(Continued)

*Primary Examiner* — Dean Takaoka
(74) *Attorney, Agent, or Firm* — Finch & Maloney PLLC

(57) ABSTRACT

According to the invention there is provided a balun including: a slotline which is coupled to an input line and an output line, in which at least a portion of the slotline is sandwiched between a first and a second layer of dielectric material.

20 Claims, 2 Drawing Sheets

(56) References Cited

U.S. PATENT DOCUMENTS

| | | | | |
|---|---|---|---|---|
| 6,891,446 | B2 | 5/2005 | Tayrani et al. | |
| 7,471,165 | B2 * | 12/2008 | Asamura | H01P 5/10 333/246 |
| 7,586,386 | B2 * | 9/2009 | Takahashi | H01P 5/1007 333/26 |
| 9,118,099 | B2 * | 8/2015 | Kim | H01P 5/10 |
| 9,564,868 | B2 * | 2/2017 | Nguyen | H01P 5/10 |
| 2002/0149440 | A1 | 10/2002 | Deckman | |
| 2002/0196096 | A1 | 12/2002 | Tajima | |
| 2004/0217823 | A1 | 11/2004 | Tayrani et al. | |
| 2006/0208825 | A1 | 9/2006 | Takahashi | |
| 2007/0001779 | A1 | 1/2007 | Asamura et al. | |
| 2009/0140823 | A1 | 6/2009 | Lee et al. | |
| 2009/0302967 | A1 | 12/2009 | Tripp | |
| 2015/0171816 | A1 | 6/2015 | Nguyen | |

FOREIGN PATENT DOCUMENTS

| | | | | |
|---|---|---|---|---|
| KR | WO 2013100432 | A1 * | 7/2013 | H01P 5/10 |
| WO | 0046921 | | 8/2000 | |
| WO | 2005057787 | A1 | 6/2005 | |
| WO | 2011094471 | A1 | 8/2011 | |
| WO | 2013190275 | A1 | 12/2013 | |
| WO | 2013190276 | A1 | 12/2013 | |

OTHER PUBLICATIONS

GB Intellectual Property Office Search Report under Section 17(5) received for GB Patent Application No. 1210816.3 mailed Oct. 8, 2012. 3 pages.

Tzyh-Ghuang Ma; Chin-Feng Chou, A Compact Multilayered Magic-T Microstrip Form and Its Application to Microwave Symposium Digest, 2008 IEEE MTT-S International, Jun. 15, 2008. pp. 887-890.

International Preliminary Report on Patentability and Written Opinion received for Patent Application No. PCT/GB2013/051571, mailed on Dec. 31, 2014. 9 pages.

International Search Report and Written Opinion received for Patent Application No. PCT/GB2013/051573, mailed on Sep. 20, 2013. 12 pages.

GB Intellectual Property Office Search Report under Section 17(5) received for GB Patent Application No. 1210817.1 mailed Oct. 8, 2012. 3 pages.

International Preliminary Report on Patentability and Written Opinion received for Patent Application No. PCT/GB2013/051573, mailed on Dec. 31, 2014. 8 pages.

* cited by examiner

BALUN

FIELD OF THE DISCLOSURE

This invention relates to a balun, antenna arrangements incorporating a balun, and to associated methods of manufacturing of a balun, with particular, but not necessarily exclusive, reference to microwave baluns.

BACKGROUND

Baluns are well known passive electrical devices. The term "balun" is derived from the abbreviation of the two terms "balance" and "unbalanced". Baluns are 3-port devices which convert signals from an unbalanced transmission line to a balanced transmission line and vice-versa. The two balanced ports should provide a signal equal in amplitude with a 180 degree phase difference.

Microwave balun devices can be implemented in various ways, such as in transformer-type arrangements, coupled transmission lines and transmission line junctions. It is known from US2005/0105637 and Bialkowski and Abbosh (M E Bialkowski and A M Abbosh, IEEE Microwave and Wireless Components Letters, Vol. 17, No. 4, April 2007) how to implement baluns using microwave techniques involving microstrips and slotlines. However, it would be desirable to improve the characteristics of these devices. In particular, it would be desirable to reduce the dimensions of these devices, and to provide relatively small scale baluns which can be effectively used in arrays.

SUMMARY

The present invention, in at least some of its embodiments, addresses the above described desires.

According to a first aspect of the invention there is provided a balun including:

a slotline which is coupled to an input line and an output line, in which at least a portion of the slotline is sandwiched between a first and second layer of dielectric material.

In this way, electric field lines which might otherwise appear in the air surrounding the slotline (so-called 'fringing fields') can instead be enclosed within the dielectric material. This increases the effective dielectric constant, resulting in the ability to utilise smaller slotline dimensions. A further advantage is that coupling to adjacent baluns or other devices or microwave features is reduced.

The balun may be of the type for dividing an input electrical signal to produce first and second output electrical signals which are substantially out of phase, the balun further including: an input port for receiving the input electrical signal, a first output port and a second output port; wherein the output line has a junction with the slotline;

in which: the input line couples the input electrical signal to the slotline; the slotline couples the input electrical signal to the junction, the junction acting as a divider to produce the first and second output electrical signals; and the output line couples the first and second output electrical signals to, respectively, the first output port and the second output port. Baluns of this type are known from US 2005/0105637, Bialkowski & Abbosh, and our co-pending application entitled "A Balun", filed on the same day as the present application, the contents of all of which are herein incorporated by reference. Generally with such devices, the first and second output electrical signals are substantially 180° out of phase, and are of substantially equal amplitude. However, the invention can be applied to other types of balun.

The skilled reader will appreciate that in general a slotline includes at least one dielectric substrate on which a slot feature is formed. It is understood that both the first and second layers of dielectric material provided by the present invention are additional to the substrate dielectric material which forms part of the slotline.

In some embodiments, the slotline includes at least one substrate formed from a dielectric material, and the first and second layers of dielectric material are formed from the same dielectric material as the substrate. In general, this is desirable since it provides optimal impedance matching.

The balun may be in the form of a printed circuit board (PCB).

The balun may be a microwave balun device. The balun may be in the form of a microwave laminate structure. Microwave laminate structures are understood to comprise one or more dielectric substrates with one or more layers of a conductor, typically copper, formed thereon in a desired pattern.

The first layer of dielectric material may be formed on an upper surface of the PCB, and the second layer of dielectric material may be formed on a lower surface of the PCB.

In some embodiments, at least one of the input line and the output line is a microstrip or a stripline. Both of the input line and the output line may be a microstrip or a stripline.

In some embodiments, the entire slotline is sandwiched between the first and second layers of dielectric material. In other words, each of the first and second layers of dielectric material have a surface area which extends over the entire surface area of the slotline.

The dielectric material of the first and second layers may be of any suitable type. Dielectric materials which are commonly employed in microwave laminate structures or which are well known in microwave applications may be utilised. As noted above, it is generally preferred that the dielectric material of the first and second layers is the same as the dielectric material used as the substrate for the slotline.

The first and second layers of dielectric material may include a ceramic material.

The first and second layers of dielectric material may be laminates.

Suitable dielectric materials can be obtained from a variety of manufacturers who will be well known to the skilled reader, such Rogers Corporation (Rogers Conn. 06263 USA) and Taconic (Petersburg, N.Y. 12138, USA). An example of a suitable dielectric material is produced by Rogers Corporation under the trade name RO 4000 (®) series high frequency circuit materials. These are glass-reinforced ceramic filled thermoset laminates. Other glass based laminates may be contemplated.

The first and second layers of dielectric material are of any suitable thickness. Typically, the first and second layers of dielectric material are each of the thickness in the range 50-500 microns, preferably 80-250 microns. However, the skilled reader will appreciate that the thickness employed will usually be influenced by parameters such as the frequency of operation and the dielectric constant of the dielectric material.

In certain embodiments, the output line is substantially symmetrical about nthe slotline. The output line may be substantially U-shaped so as to provide output ports that are opposite the input port.

The slotline may have two ends which are each terminated by a termination such as an open circuit termination.

The input line may have a first end which is coupled to the input port and a second end which is terminated by an open circuit termination or a short circuit termination.

The balun may have a plurality of vias formed therein. The vias may be disposed so as to suppress parallel plate modes, for example parallel plate modes caused by asymmetry in components of the balun, particularly layer structures.

The balun may operate at input frequencies in the range 1 to 40 GHz or thereabouts. In some embodiments, the balun operates at frequencies in the range 2 to 18 GHz. Higher frequencies than 40 GHz may be possible with appropriate manufacturing techniques.

According to a second aspect of the invention there is provided an array of baluns according to the first aspect of the invention.

It is advantageous that the present invention can provide reduced coupling between adjacent baluns.

According to a third aspect of the invention there is provided an antenna arrangement including at least one antenna which is fed electrical signals from a balun according to the first aspect of the invention or an array of baluns according to the second aspect of the invention.

According to a fourth aspect of the invention there is provided a method of manufacturing a balun including the steps of:

providing a balun structure having a slotline which is coupled to an input line and an output line; and forming a first and a second layer of dielectric material on at least a portion of the slotline so as to sandwich at least a portion to the slotline between said first and second layers.

The first and second layer of dielectric material can be formed on the slotline in any suitable manner. Typically, the first and second layers of dielectric material are adhered or otherwise attached to the slotline using a suitable intermediate layer, such as bond-ply.

Whilst the invention has been described above, it extends to any inventive combination of the features set out above, or in the following description, drawings or claims.

BRIEF DESCRIPTION OF THE DRAWINGS

Embodiments of devices in accordance with the invention will now be described with reference to the accompanying drawings, in which:—

DETAILED DESCRIPTION

Figure 1:
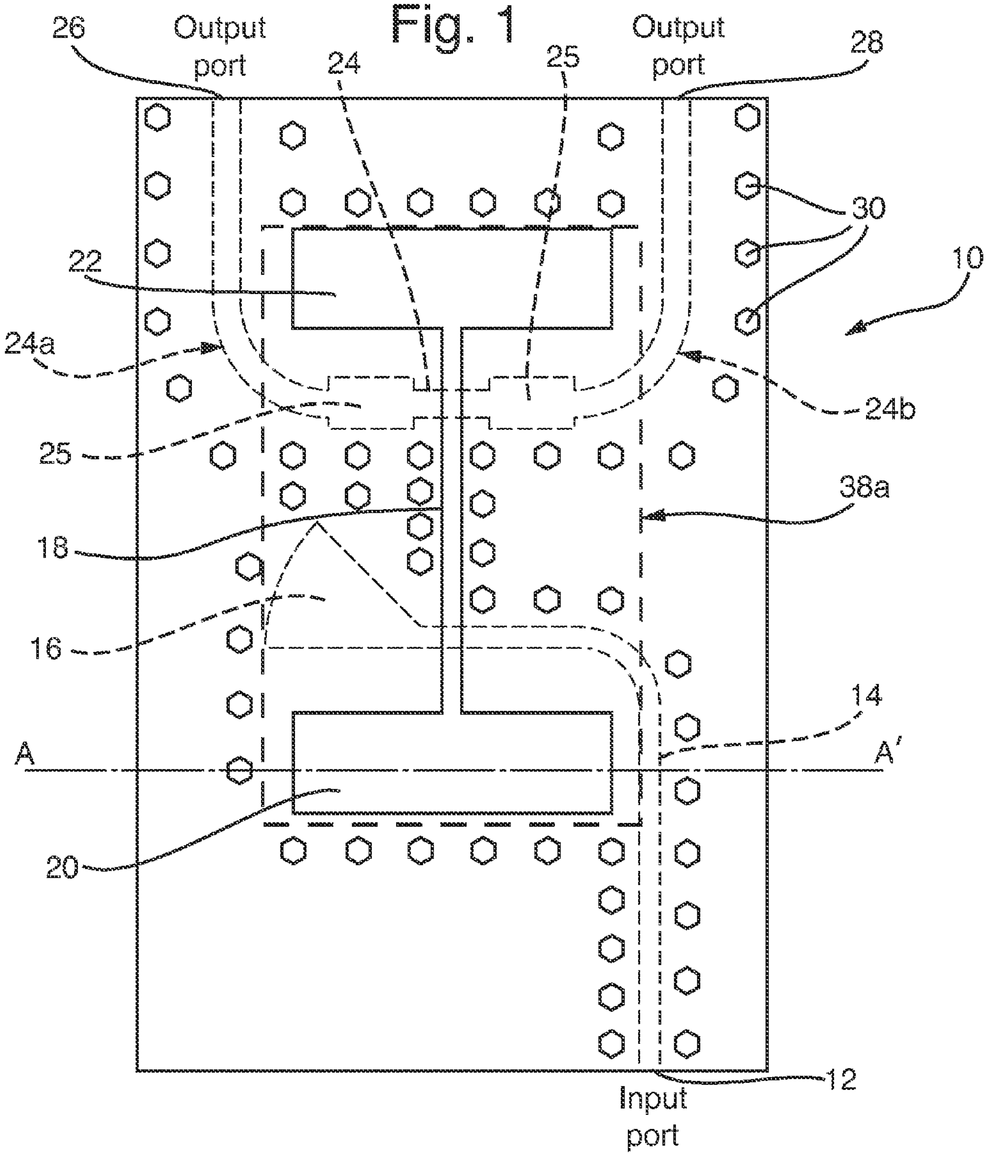
FIG. 1 shows (a) a plan view of a balun of the invention and (b) a cross sectional view along the line A-A'.
Figure 1A:
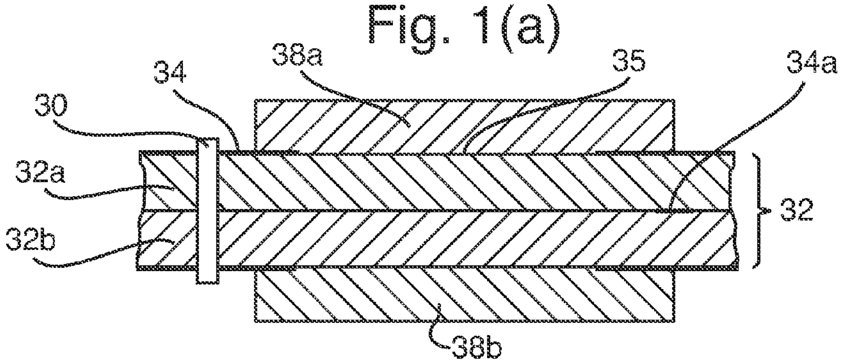

FIG. 1 shows an embodiment of a balun of the invention, depicted generally at 10, in the form of a PCB. The balun 10 has an input port 12 leading to an input line 14 which can be a microstrip or a stripline. The input line 14 terminates in an open circuit stub 16. The balun 10 further comprises a slotline 18. The slotline 18 is terminated at both of its ends by open circuits 20, 22. Just prior to its termination by the stub 16, the input line 14 crosses the slotline 18 substantially at right angles to form an input line—slotline junction. This junction is formed towards the end of the slotline 18 which is closest to the input port 12. The balun 10 further comprises a generally U-shaped output line 24. The output line 24 can be in the form of a microstrip or a stripline. The output line 24 crosses the slotline 18 substantially at right angles to form a junction. This junction is formed towards the end of the slotline 18 which is nearer to output ports 26, 28. The output line 24 can be regarded as comprising two arms 24*a*, 24*b*. The arm 24*a* connects the junction of the output line 24 with the slotline 18 to the output port 26. The arm 24*b* connects the junction of the output line 24 with the slotline 18 to the output port 28. The balun 10 further comprises a plurality of circular vias 30 which, as would be readily understood by the skilled reader, are plated through holes in the PCB structure.

The PCB comprises a dielectric substrate 32 which is made up of a first substrate layer 32*a* and a second substrate layer 32*b* which can be attached in a suitable manner, such as by bond-ply. Layers of copper present are shown with thick lines and denoted by the numeral 34. A copper layer 34*a* is part of the microstrip 14. The copper layers 34 are removed in the central region of the dielectric substrate 32 as shown in FIG. 1(*a*) to leave a slot 35 which corresponds to the open circuit 20.

The balun 10 can be considered to have two sections, namely an input section which includes a transition from the input line 14 (a stripline or microstrip track) to the slotline 18, and an output section which includes a transition from a slotline 18 to the output line 24 (two stripline or microstrip tracks 24*a*, 24*b*). In use, an input electrical signal is inputted at the input port 12 and is coupled via the input line 14 and the slotline 18 to the junction between the slotline 18 and the output line 24. At this junction substantially identical contra-propagating electrical signals of opposite polarity are created which are coupled by the arms 24*a*, 24*b* to the output ports 26, 28.

The balun 10 further comprises two discrete, additional layers of dielectric material. In particular, the balun 10 comprises a discrete upper layer 38*a* of a dielectric material which is provided on an upper face of the PCB, and a discrete lower layer 38*b* of a dielectric material provided on a lower face of the PCB. It is preferred that the upper and lower layers 38*a*, 38*b* are formed from the same dielectric material as used in the PCB. The upper and lower dielectric layers 38*a*, 38*b* are formed so as to entirely cover the slotline structure 18, 20, 22. The upper layer of dielectric material 38*a* is shown in FIG. 1(*a*) where it is seen to be in the form of a rectangle. Other shapes may be utilised, and the area of the device covered by the upper and lower layers of dielectric material 38*a*, 38*b* may be varied. Typically, the upper 38*a* and lower 38*b* layers of dielectric material are in register with each other, but it is not necessary that this is so.

In a typical prior art slotline structure, a slot is formed in a copper surface on one face of a microwave laminate. Typically this face has a dielectric substrate on one side and air on the other. This results in an effective dielectric constant which is of a value somewhere between that of the substrate and that of air. The dielectric constant of air is assumed to have a value of one, wherein the dielectric constant of a typical microwave substrate material is usually greater than 2.2. The effective dielectric constant for this type of slotline is lower than that for the substrate because some of the field lines formed by a signal propagating along the transmission line appear in the substrate and some appear in the air surrounding the slot. The additional layers of dielectric material provided by this aspect of the present invention has the effect that field lines which would otherwise appear in the air surrounding the slotline are instead enclosed within the dielectric material. The air-dielectric boundary creates an impedance mismatch which limits propagation of field lines beyond this boundary. Accordingly, the effective dielectric constant is increased. This has the advantage that smaller slotline dimensions can be employed, which in turn enables baluns of reduced dimensions to be provided. A further advantage is that, because there is reduced propagation away from the transmission line structure, coupling to any adjacent baluns (or other microwave features or devices) is also reduced. This is particularly advantageous when multiple baluns are used in arrays. An example of this is when multiple baluns are used in arrays of antennas where the radiating elements spacing is limited and signal coupling between baluns may affect performance. Similar advantages may arise in other devices which feature slotline structures.

Typical dimensions for the stub and other terminations are of the order of a quarter of a wavelength or less at the centre frequency. Representative but non-limiting dimensions for a balun operating up to 18 GHz are ca. 9 mm×18 mm×1 mm, although the skilled reader will appreciate that the dimensions utilised depend upon the dielectric constant and the thickness of the laminate and substrate materials used. A representative but non-limiting thickness for each of the upper and lower layers of dielectric material are ca. 100-200 microns.

The vias 30 are disposed as to suppress parallel plate modes caused by slight asymmetry in the layers making up the PCB structure.

Figure 2A:
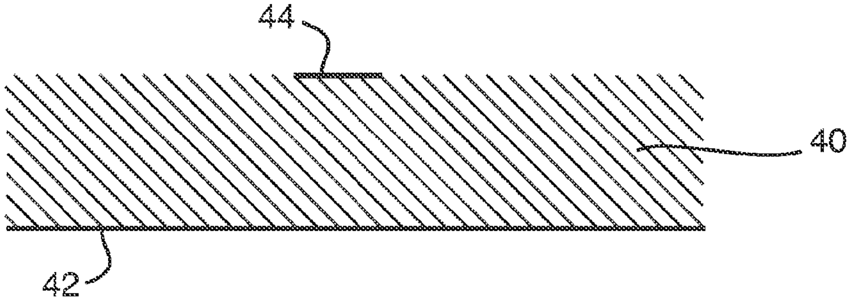
FIG. 2 shows cross sectional views of (a) a microstrip, (b) a stripline and (c) a slotline.
Figure 2B:
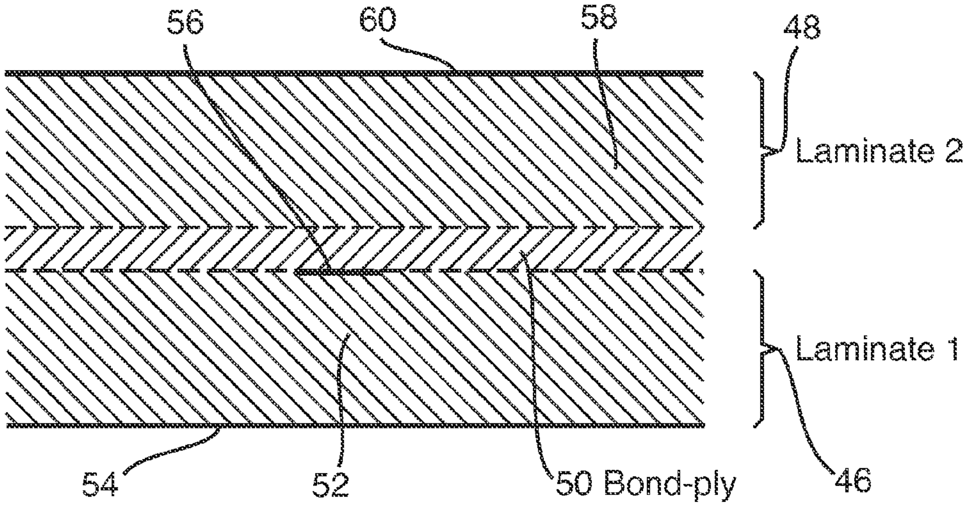
Figure 2C:
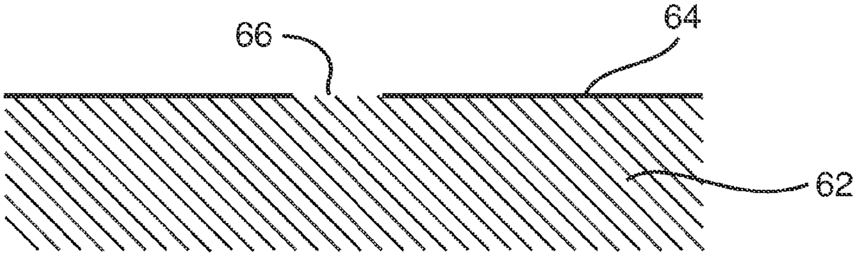

Baluns such as those described with reference to FIG. 1 can be fabricated using standard microwave PCB manufacturing techniques. For microwave baluns, PCBs are generally of the type known as microwave laminates which make use of low-loss copper-clad dielectric substrates. Suitable PCBs can be obtained from a variety of manufacturers who will be well known to the skilled reader, such as Rogers Corporation (Rogers, Conn. 06263, USA) and Taconic (Petersburg, N.Y. 12138, USA). The device structure can be produced by removing copper from desired areas of one or both sides of the laminate. It is also possible to bond laminate sheets together to form multi-layer structures. Multi-layer structures may have multiple combinations of microstrip, stripline or slotline transmission lines. Copper removal is performed to provide copper patterns which are used to form the desired microstrip, stripline or slotline features. FIG. 2 shows generalised cross sectional views of (a) a microstrip, (b) a stripline and (c) a slotline. FIG. 2 (*a*) shows a microstrip formed from a microwave laminate comprising a dielectric substrate 40 having a full copper layer 42 on a lower face thereof. Copper has been removed on the upper face of the dielectric substrate 40 to leave a copper track 44. FIG. 2(*b*) shows a stripline formed as a multi-layer structure comprising a first microwave laminate 46, and second microwave laminate 48, and a bond-ply sheet 50 which is used to secure the laminates 46, 48 to each other. The first microwave laminate 46 comprising a dielectric substrate 52 having a complete copper layer 54 formed over a lower face thereof. Copper is removed on the upper face of the dielectric substrate 52 to leave a copper track 56. Copper is removed entirely from a lower face of a dielectric substrate 58 of the microwave laminate 48. The upper face of the dielectric substrate 58 retains a complete copper layer 60. Typically, vias (also known as Plated Through Holes (PTH)) are used to limit the propagation of parallel plate loads resulting from the asymmetry caused by the bond-ply 50. FIG. 2(*c*) shows a slotline formed from a microwave laminate which comprises a dielectric substrate 62 having a copper layer 64 on an upper face thereof. Copper is removed from the copper layer 64 to create a slot. The copper on the lower face of the dielectric substrate 62 may be removed entirely.

Baluns of the invention are particularly suitable for use in feeding an antenna. An array of baluns may be utilised. However, the baluns of the invention may be used for other purposes such as in a microwave circuit.

The invention claimed is:

1. A balun comprising:

a slotline coupled to an input line and an output line, wherein the slotline includes a substrate, and wherein at least a portion of the input line, at least a portion of the output line, at least a portion of the slotline and at least a portion of the substrate are each sandwiched between a first and a second layer of dielectric material.

2. The balun according to claim 1 further comprising:

an input port for receiving an input electrical signal, a first output port and a second output port;

wherein the output line has a junction with the slotline; and wherein:

the input line couples the input electrical signal to the slotline;

the slotline couples the input electrical signal to the junction, the junction acting as a divider to produce first and second output electrical signals; and the output line couples the first and second output electrical signals to, respectively, the first output port and the second output port.

3. The balun according to claim 1, wherein the substrate is formed from a dielectric material, and the first and second layers of dielectric material are formed from the same dielectric material as the substrate.

4. The balun according to claim 1 in the form of a printed circuit board (PCB).

5. The balun according to claim 1 in the form of a printed circuit board (PCB) and in the form of a microwave laminate structure.

6. The balun according to claim 5, wherein the first layer of dielectric material is formed on an upper surface of the PCB, and the second layer of dielectric material is formed on a lower surface of the PCB.

7. The balun according to claim 1, wherein at least one of the input line and the output line is one of the microstrip and the stripline.

8. The balun according to claim 1, wherein the entire slotline is sandwiched between the first and second layers of dielectric material.

9. The balun according to claim 1, wherein each of the first and second layers of dielectric material includes a ceramic material.

10. The balun according to claim 1, wherein the first and second layers of dielectric material are laminates.

11. The balun according to claim 1, wherein the first and second layers of dielectric material are each of a thickness in the range of 50-500 microns.

12. The balun according to claim 1, further comprising at least one antenna which is fed electrical signals from the output line of the balun.

13. A method of manufacturing a balun, the method comprising:

providing a balun structure having a slotline coupled to an input line and an output line, wherein the slotline includes a substrate having one of a microstrip and a stripline disposed thereon; and forming a first and a second layer of dielectric material on at least a portion of the input line, at least a portion of the output line, at least a portion of the slotline and at least a portion of the substrate so as to sandwich the respective portions of the input line, the output line, the slotline and the substrate between the first and second layers of dielectric material.

14. A balun comprising:

a slotline coupled to an input line and an output line, wherein at least a portion of the slotline is sandwiched between a first and a second layer of dielectric material, and wherein the slotline includes at least one substrate formed from a dielectric material, and the first and second layers of dielectric material are formed from the same dielectric material as the substrate.

15. The balun according to claim 14, further comprising:

an input port for receiving an input electrical signal, a first output port and a second output port;

wherein the output line has a junction with the slotline; and wherein:

the input line couples the input electrical signal to the slotline;

the slotline couples the input electrical signal to the junction, the junction acting as a divider to produce first and second output electrical signals; and the output line couples the first and second output electrical signals to, respectively, the first output port and the second output port.

16. The balun according to claim 14, wherein the first and second layers of dielectric material are each of a thickness in the range of 50-500 microns.

17. The balun according to claim 14, further comprising at least one antenna which is fed electrical signals from the output line of the balun.

18. A balun comprising:

a slotline which is coupled to an input line and an output line, wherein at least a portion of the slotline is sandwiched between a first and a second layer of dielectric material, and wherein the first and second layers of dielectric material are each of a thickness in the range of 50-500 microns.

19. The balun according to claim 18, further comprising:

an input port for receiving an input electrical signal, a first output port and a second output port;

wherein the output line has a junction with the slotline; and wherein:

the input line couples the input electrical signal to the slotline;

the slotline couples the input electrical signal to the junction, the junction acting as a divider to produce first and second output electrical signals; and the output line couples the first and second output electrical signals to, respectively, the first output port and the second output port.

20. The balun according to claim 18, wherein the slotline includes at least one-substrate formed from a dielectric material, and the first and second layers of dielectric material are formed from the same dielectric material as the substrate.

* * * * *